(12) United States Patent
Hashimoto et al.

(10) Patent No.: US 10,755,921 B2
(45) Date of Patent: Aug. 25, 2020

(54) METHOD OF MANUFACTURING SEMICONDUCTOR DEVICE, SUBSTRATE PROCESSING APPARATUS AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Tatsuru Matsuoka, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 109 days.

(21) Appl. No.: 15/456,646

(22) Filed: Mar. 13, 2017

(65) Prior Publication Data

US 2017/0271144 A1 Sep. 21, 2017

(30) Foreign Application Priority Data

Mar. 18, 2016 (JP) .................. 2016-055345

(51) Int. Cl.
*H01L 21/02* (2006.01)
*C23C 16/34* (2006.01)
(Continued)

(52) U.S. Cl.
CPC ........ *H01L 21/0228* (2013.01); *C23C 16/345* (2013.01); *C23C 16/4412* (2013.01);
(Continued)

(58) Field of Classification Search
CPC ............ C23C 16/345; C23C 16/45553; C23C 16/308; C23C 16/401; C23C 16/402;
(Continued)

(56) References Cited

U.S. PATENT DOCUMENTS 9,214,333 B1 * 12/2015 Sims .................. H01L 21/0217
9,741,555 B2 * 8/2017 Hashimoto ....... H01J 37/32522
(Continued)

FOREIGN PATENT DOCUMENTS

JP      2004-277864 A      10/2004
JP      2013-093551 A       5/2013
(Continued)

OTHER PUBLICATIONS

Korean Office Action dated Jul. 19, 2018 for the Korean Patent Application No. 10-2017-0029962.

*Primary Examiner* — Edward Chin
(74) *Attorney, Agent, or Firm* — Volpe and Koenig, P.C.

(57) ABSTRACT

A method of manufacturing a semiconductor device, includes forming a film on a substrate by performing a cycle a predetermined number of times. The cycle includes non-simultaneously performing (a) supplying a precursor containing a first element to the substrate, (b) supplying a plasma-excited nitrogen gas to the substrate after the act (a), (c) supplying a reactant containing a second element to the substrate after the act (b), and (d) supplying a plasma-excited nitrogen gas to the substrate after the act (c). A gas purge of a space where the substrate is located and vacuumization of the space without gas supply are not performed between the act (a) and the act (b) and between the act (c) and the act (d).

14 Claims, 9 Drawing Sheets

(51) Int. Cl.
  *C23C 16/44* (2006.01)
  *C23C 16/455* (2006.01)
  *C23C 16/52* (2006.01)

(52) U.S. Cl.
  CPC .... *C23C 16/4554* (2013.01); *C23C 16/45544* (2013.01); *C23C 16/45561* (2013.01); *C23C 16/52* (2013.01); *H01L 21/0217* (2013.01); *H01L 21/02211* (2013.01); *H01L 21/02274* (2013.01); *H01L 21/0214* (2013.01); *H01L 21/02126* (2013.01); *H01L 21/02164* (2013.01); *H01L 21/02167* (2013.01)

(58) Field of Classification Search
  CPC ............ C23C 16/455; C23C 16/45536; C23C 16/515; C23C 16/52; C23C 16/56; C07F 7/025; C07F 7/10; C01B 21/087; C01B 21/088
  See application file for complete search history.

(56) References Cited

U.S. PATENT DOCUMENTS

| | | | |
|---|---|---|---|
| 9,777,025 B2* | 10/2017 | Girard | H01L 21/02222 |
| 9,822,132 B2* | 11/2017 | Kuchenbeiser | C23C 16/345 |
| 2013/0171838 A1 | 7/2013 | Okuda | |
| 2015/0004804 A1 | 1/2015 | Orihashi et al. | |

FOREIGN PATENT DOCUMENTS

| | | |
|---|---|---|
| KR | 10-2013-0038137 A | 4/2013 |
| KR | 10-2015-0002495 A | 1/2015 |

* cited by examiner

METHOD OF MANUFACTURING SEMICONDUCTOR DEVICE, SUBSTRATE PROCESSING APPARATUS AND RECORDING MEDIUM

CROSS-REFERENCE TO RELATED APPLICATION

This application is based upon and claims the benefit of priority from Japanese Patent Application No. 2016-055345, filed on Mar. 18, 2016, the entire contents of which are incorporated herein by reference.

TECHNICAL FIELD

The present disclosure relates to a method of manufacturing a semiconductor device, a substrate processing apparatus, and a recording medium.

BACKGROUND

A process of forming a film such as a nitride film on a substrate is often performed by alternately supplying a precursor and a reactant such as a nitriding agent to the substrate. The nitride film has excellent insulating properties, corrosion resistance, dielectric properties, film stress controllability and the like, and has been widely used as an insulating film, a mask film, a charge storage film, a stress control film of semiconductor devices. It is also used as various etch stops, but there is also a demand for reducing thickness with the miniaturization of transistors. There is a trade-off relationship between the thinning and etching resistance. In order to improve the etching resistance, a method is also known in which chlorine which will be an impurity is reduced by supplying a plasma-excited hydrogen gas while alternately supplying the precursor and the reactant.

In the above method, however, although the chlorine concentration within a film may be reduced in a low temperature region, it may be difficult to reduce the hydrogen concentration within the film.

SUMMARY

The present disclosure provides some embodiments of a technique capable of reducing a concentration of an impurity within a film, particularly a hydrogen concentration, and forming a high quality film with excellent etching resistance.

According to one embodiment of the present disclosure, there is provided a technique including: forming a film on a substrate by performing a cycle a predetermined number of times, the cycle including non-simultaneously performing: (a) supplying a precursor containing a first element to the substrate; (b) supplying a plasma-excited nitrogen gas to the substrate after the act (a); (c) supplying a reactant containing a second element to the substrate after the act (b); and (d) supplying a plasma-excited nitrogen gas to the substrate after the act (c), wherein a gas purge of a space where the substrate is located and vacuumization of the space without gas supply are not performed between the act (a) and the act (b) and between the act (c) and the act (d).

DETAILED DESCRIPTION

<One Embodiment of the Present Disclosure>

One embodiment of the present disclosure will now be described with reference to the drawings.

(1) Configuration of the Substrate Processing Apparatus

Figure 1:
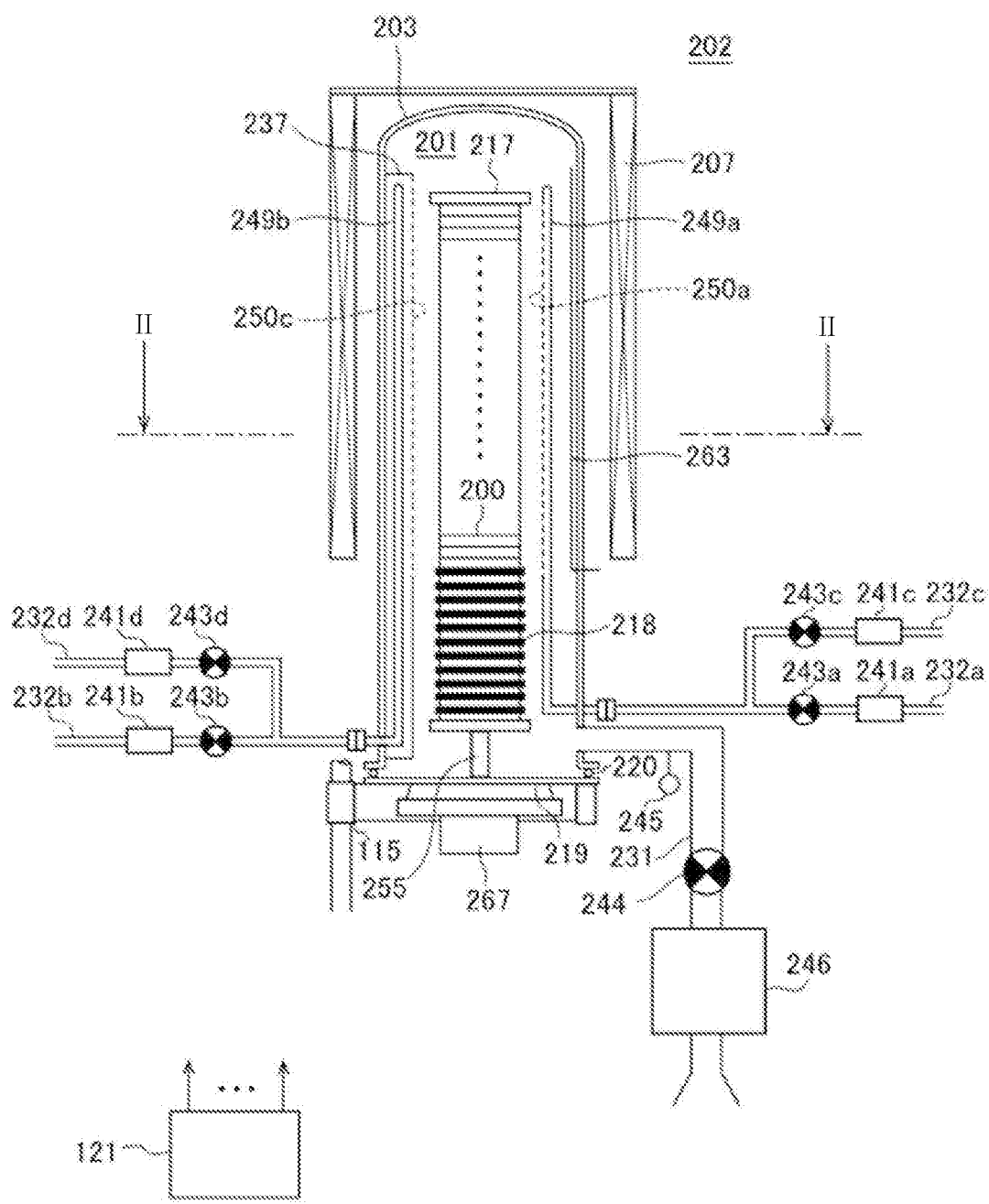
FIG. 1 is a schematic configuration diagram of a vertical type processing furnace of a substrate processing apparatus suitably used in one embodiment of the present disclosure, in which a portion of the processing furnace is shown in a vertical cross sectional view.

As illustrated in FIG. 1, a processing furnace 202 includes a heater 207 as a heating means (heating mechanism). The heater 207 having a cylindrical shape is supported by a heater base (not shown) serving as a retaining plate, so that it is vertically installed. As will be described herein below, the heater 207 functions as an activation mechanism (an excitation part) configured to thermally activate (excite) a gas.

A reaction tube 203 forming a reaction vessel (process vessel) is disposed inside the heater 207 in a concentric relationship with the heater 207. The reaction tube 203 is made of a heat resistant material such as, e.g., quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed in the process chamber 201 so as to penetrate a lower sidewall of the reaction tube 203. The nozzles 249a and 249b are made of a heat resistant material such as quartz or SiC. Gas supply pipes 232a and 232b are respectively connected to the nozzles 249a and 249b. In this way, the two nozzles 249a and 249b and the two gas supply pipes 232a and 232b are installed in the reaction tube 203 and are capable of supplying plural types of gases into the process chamber 201.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d, which supply an inert gas, are respectively connected to the gas supply pipes 232a and 232b at the downstream side of the valves 243a and 243b. MFCs 241c and 241d and valves 243c and 243d are respectively installed in the gas supply pipes 232c and 232d in this order from the upstream sides.

Figure 2:
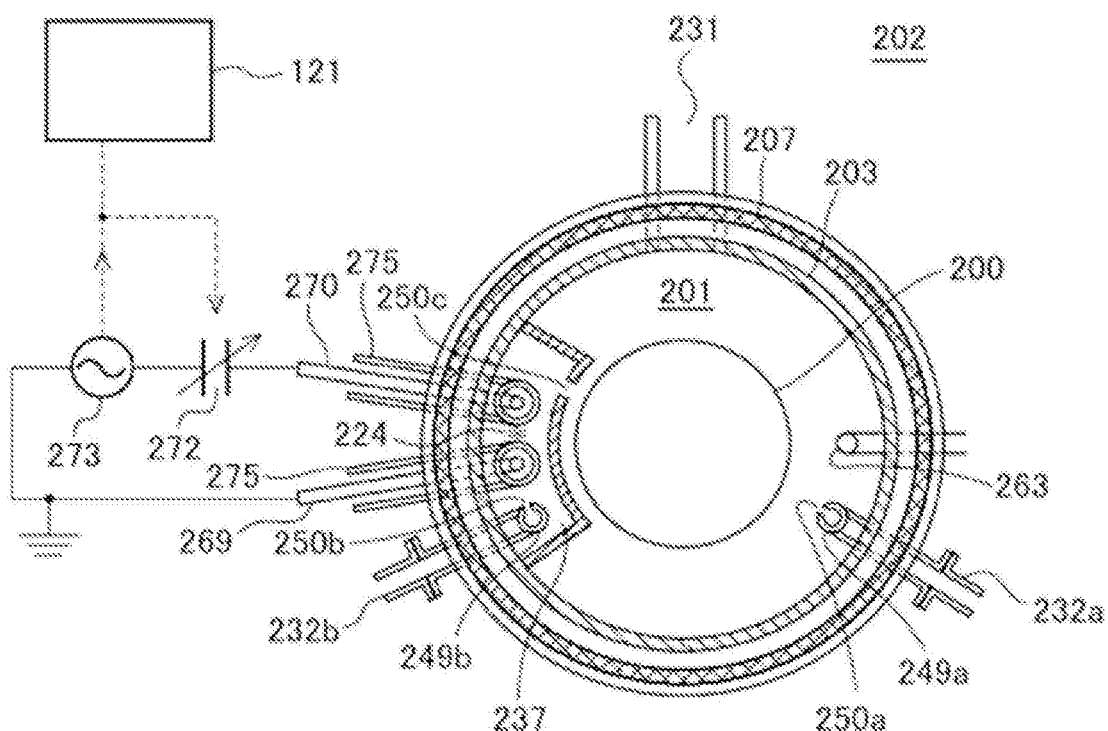
FIG. 2 is a schematic configuration diagram of the vertical type processing furnace of the substrate processing apparatus suitably used in one embodiment of the present disclosure, in which a portion of the processing furnace is shown in a cross sectional view taken along line II-II in FIG. 1.

As illustrated in FIG. 2, the nozzle 249a is disposed in a space with an annular shape when seen in a plane view between the inner wall of the reaction tube 203 and the wafers 200 such that the nozzle 249a extends upward along a stacking direction of the wafers 200 from a lower portion of the inner wall of the reaction tube 203 to an upper portion of the inner wall of the reaction tube 203. Specifically, the nozzle 249a is installed at a lateral side of a wafer arrangement region in which the wafers 200 are arranged, namely in a region which horizontally surrounds the wafer arrangement region, so as to extend along the wafer arrangement region. Gas supply holes 250a for supplying a gas are formed on the side surface of the nozzle 249a. The gas supply holes 250a are opened toward the center of the reaction tube 203 so as to allow a gas to be supplied toward the wafers 200. The gas supply holes 250a may be formed in a plural number between the lower portion of the reaction tube 203 and the upper portion of the reaction tube 203.

The nozzle 249b is installed within a buffer chamber 237. The buffer chamber 237 functions as a gas diffusion space. The buffer chamber 237 is formed in a space with an annular shape, when seen in a plane view, between the inner wall of the reaction tube 203 and the wafers 200 such that the buffer chamber 237 is formed along the stacking direction of the wafers 200 from the lower portion of the inner wall of the reaction tube 203 to the upper portion of the inner wall of the reaction tube 203. That is, the buffer chamber 237 is formed in a region which horizontally surrounds the wafer arrangement region and which is positioned at the lateral side of the wafer arrangement region, along the wafer arrangement region. The buffer chamber 237 is formed between the inner wall of the reaction tube 203 and a partition wall. Gas supply holes 250c for supplying a gas are formed in an end portion of the partition wall which adjoins the wafers 200 in the buffer chamber 237. The gas supply holes 250c are opened toward the center of the reaction tube 203 so as to allow a gas to be supplied toward the wafers 200. The gas supply holes 250c may be formed in a plural number between the lower portion of the reaction tube 203 and the upper portion of the reaction tube 203.

The nozzle 249b is installed in an end portion of the buffer chamber 237 opposite to the end portion of the buffer chamber 237 having the gas supply holes 250c such that the nozzle 249b extends upward along the stacking direction of the wafers 200 from the lower portion of the inner wall of the reaction tube 203 to the upper portion of the reaction tube 203. Specifically, the nozzle 249b is installed in a region which horizontally surrounds the wafer arrangement region where the wafers 200 are arranged and which is positioned at the lateral side of the wafer arrangement region, along the wafer arrangement region. Gas supply holes 250b for supplying a gas are formed on the side surface of the nozzle 249b. The gas supply holes 250b are opened toward the center of the buffer chamber 237. Similar to the gas supply holes 250c, the gas supply holes 250b may be formed in a plural number between the lower portion of the reaction tube 203 and the upper portion of the reaction tube 203.

As described above, in the present embodiment, a gas is transferred through the nozzles 249a and 249b and the buffer chamber 237, which are disposed in a vertically-elongated space with an annular shape, when seen in a plane view, i.e., a cylindrical space, defined by the inner sidewall of the reaction tube 203 and the end portions (peripheral edge portions) of the wafers 200 arranged within the reaction tube 203. The gas is initially injected into the reaction tube 203, near the wafers 200, through the gas supply holes 250a to 250c formed through the nozzles 249a and 249b and the partition wall of the buffer chamber 237. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the uniformity in the thickness of a thin film formed on each of the wafers 200. In addition, the gas flowing on the surfaces of the wafers 200 after the reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A precursor containing a first element (major element), for example, a halosilane precursor gas containing silicon (Si) as the first element and a halogen element, is supplied from the gas supply pipe 232a into the process chamber 201 via the MFC 241a, the valve 243a and the nozzle 249a.

The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane precursor refers to a silane precursor having a halogen group. The halogen group includes a chloro group, a fluoro group, a bromo group, an iodo group and the like. That is, the halogen group includes halogen elements such as chlorine (Cl), fluorine (F), bromine (Br), iodine (I) and the like. Furthermore, the precursor gas may be simply referred to as a precursor, for the sake of convenience.

As the halosilane precursor gas, it may be possible to use, for example, a precursor gas containing Si and Cl, i.e., a chlorosilane precursor gas. As the chlorosilane precursor gas, it may be possible to use, for example, a hexachlorodisilane ($Si_2Cl_6$, abbreviation: HCDS) gas.

A reactant (reaction gas) having a chemical structure (molecular structure) different from that of the precursor gas and containing a second element, for example, a gas containing nitrogen (N) (N-containing gas) as the second element, is supplied from the gas supply pipe 232b into the process chamber 201 via the MFC 241b, the valve 243b, the nozzle 249b and the buffer chamber 237. As the N-containing gas, it may be possible to use, for example, a hydrogen nitride-based gas. The hydrogen nitride-based gas may also refer to a material consisting of only two elements of N and H and acts as a nitriding agent, i.e., a nitriding gas (N source), in a film forming process which will be described later. As the hydrogen nitride-based gas, it may be possible to use, for example, an ammonia ($NH_3$) gas.

An inert gas, for example, an $N_2$ gas, is supplied from the gas supply pipes 232c and 232d into the process chamber 201 via the MFCs 241c and 241d, the valves 243c and 243d, the gas supply pipes 232a and 232b, the nozzles 249a and 249b, and the buffer chamber 237.

A precursor supply system is mainly configured by the gas supply pipe 232a, the MFC 241a and the valve 243a. A reactant supply system is mainly configured by the gas supply pipe 232b, the MFC 241b and the valve 243b. An inert gas supply system ($N_2$ gas supply system) is mainly configured by the gas supply pipes 232c and 232d, the MFCs 241c and 241d, and the valves 243c and 243d.

As illustrated in FIG. 2, two rod-shaped electrodes 269 and 270 made of a conductive material and having an elongated structure are disposed within the buffer chamber 237 so as to extend along the arrangement direction of the wafers 200 from the lower portion of the reaction tube 203 to the upper portion of the reaction tube 203. The respective rod-shaped electrodes 269 and 270 are installed parallel to the nozzle 249b. Each of the rod-shaped electrodes 269 and 270 is covered with and protected by an electrode protection tube 275 from the upper portion to the lower portion of the rod-shaped electrodes 269 and 270. One of the rod-shaped electrodes 269 and 270 is connected to a high-frequency power source 273 via a matcher 272 and the other is connected to a ground which is a reference potential. By applying radio-frequency (RF) power from the high-frequency power source 273 to the rod-shaped electrodes 269 and 270 via the matcher 272, plasma is generated in a plasma generation region 224 between the rod-shaped electrodes 269 and 270. A plasma source as a plasma generator (plasma generation part) is mainly configured by the rod-shaped electrodes 269 and 270 and the electrode protection tubes 275. The matcher 272 and the high-frequency power source 273 may be regarded as being included in the plasma source. As will be described later, the plasma source functions as a plasma excitation part (activation mechanism) for plasma-exciting a gas, namely exciting (or activating) a gas in a plasma state.

The electrode protection tubes 275 have a structure that enables the respective rod-shaped electrodes 269 and 270 to be inserted into the buffer chamber 237 in a state in which the rod-shaped electrodes 269 and 270 are isolated from the internal atmosphere of the buffer chamber 237. If an O concentration within the electrode protection tubes 275 is substantially equal to an O concentration in the ambient air, the rod-shaped electrodes 269 and 270 respectively inserted into the electrode protection tubes 275 may be oxidized by the heat generated from the heater 207. By filling an inert gas such as an $N_2$ gas or the like into the electrode protection tubes 275, or by purging the interior of the electrode protection tubes 275 with an inert gas such as an $N_2$ gas or the like through the use of an inert gas purge mechanism, it is possible to reduce the O concentration within the electrode protection tubes 275 and to prevent the oxidation of the rod-shaped electrodes 269 and 270.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is a valve configured so that the vacuum exhaust of the interior of the process chamber 201 and the vacuum exhaust stop can be performed by opening and closing the APC valve 243 while operating the vacuum pump 246 and so that the internal pressure of the process chamber 201 can be controlled by adjusting the opening degree of the APC valve 243 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevation mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are horizontally installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is installed along the inner wall of the reaction tube 203.

Figure 3:
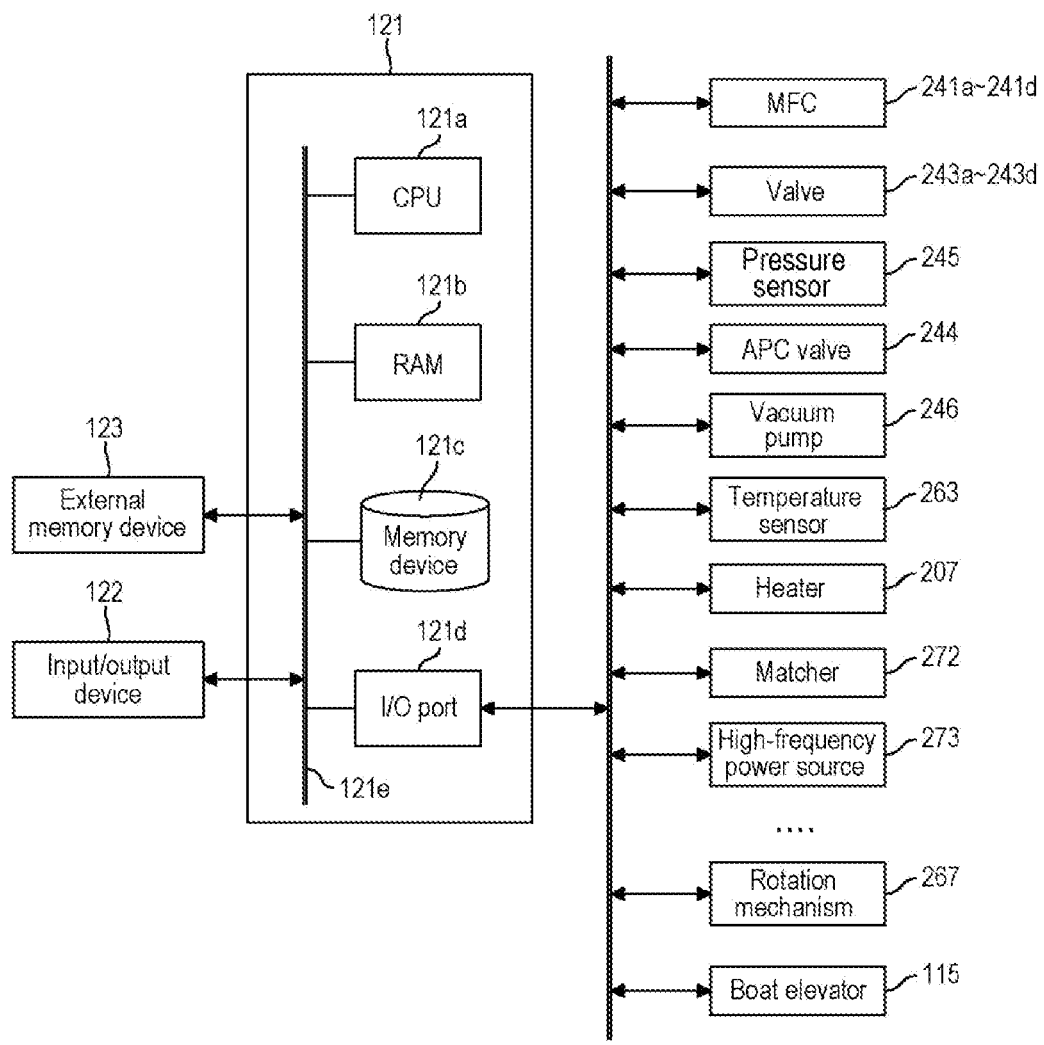
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus, a process recipe for specifying sequences and conditions of substrate processing as described herein below, or the like is readably stored in the memory device 121c. The process recipe functions as a program for causing the controller 121 to execute each sequence in the substrate processing process as described herein below, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the process recipe, a case of including only the control program, or a case of including both the process recipe and the control program. The RAM 121b constitutes a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the high-frequency power source 273, the matcher 272, the rotation mechanism 267, the boat elevator 115, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the power supply to the high-frequency power source 273, the impedance adjustment operation using the matcher 272, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123 (for example, a magnetic disc such as a hard disc, an optical disc such as a CD, a magneto-optical disc such as an MO, or a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing Process

A sequence example of forming a film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

In the film forming sequence illustrated in FIG. 4, a silicon nitride film ($Si_3N_4$, hereinafter also referred to as an "SiN film") is formed on a wafer 200 by performing a cycle a predetermined number of times (once or more), the cycle including non-simultaneously performing: step 1 of supplying an HCDS gas as a precursor to the wafer 200 as a substrate; step 2 of supplying a plasma-excited $N_2$ gas to the wafer 200; step 3 of supplying a plasma-excited $NH_3$ gas as a nitriding agent to the substrate; and step 4 of supplying a plasma-excited $N_2$ gas to the wafer 200.

Furthermore, while the cycle is performed a predetermined number of times, purge using an inert gas (hereinafter, also referred to simply as "gas purge") in the process chamber or vacuumization of the process chamber in a non-gas supply state (hereinafter, also referred to simply as "vacuumization") is not performed between the respective steps.

In the present disclosure, for the sake of convenience, the film forming sequence mentioned above may sometimes be denoted as follows. The same denotation will be used in the embodiment, the modifications and other embodiments as described herein below.

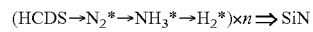

$(HCDS \rightarrow N_2^* \rightarrow NH_3^* \rightarrow H_2^*) \times n \Rightarrow SiN$ When the term "wafer" is used herein, it may refer to "a wafer itself" or "a laminated body (a collected body) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220b.

(Pressure Regulation and Temperature Adjustment)

The interior of the process chamber 201, namely the space in which the wafers 200 exist is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information (pressure regulation). The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution (temperature adjustment). In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

[HCDS Gas Supply Process]

(Step 1)

The valve 243a is opened to allow an HCDS gas to flow through the gas supply pipe 232a. The flow rate of the HCDS gas is adjusted by the MFC 241a. The HCDS gas is supplied into the process chamber 201 via the nozzle 249a and is exhausted from the exhaust pipe 231. At this time, the HCDS gas is supplied to the wafer 200. Simultaneously, the valve 243c is opened to allow an $N_2$ gas to flow through the gas supply pipe 232c. The flow rate of the $N_2$ gas is adjusted by the MFC 241c. The $N_2$ gas is supplied into the process chamber 201 together with the HCDS gas and is exhausted from the exhaust pipe 231.

Furthermore, in order to prevent the HCDS gas from entering the buffer chamber 237 and the nozzle 249b, the valve 243d is opened to allow the $N_2$ gas to flow through the gas supply pipe 232d. The $N_2$ gas is supplied into the process chamber 201 via the gas supply pipe 232b, the nozzle 249b and the buffer chamber 237 and is exhausted from the exhaust pipe 231.

The supply flow rate of the HCDS gas controlled by the MFC 241a may be set at a predetermined flow rate which falls within a range of, for example, 1 to 2,000 sccm, specifically 10 to 1,000 sccm. The supply flow rates of the $N_2$ gas controlled by the MFCs 241c and 241d may be respectively set at a predetermined flow rate which falls within a range of, for example, 100 to 10,000 sccm. The internal pressure of the process chamber 201 may be set to be a predetermined pressure which falls within a range of, for example, 1 to 2,666 Pa, specifically 67 to 1,333 Pa. The time period, during which the HCDS gas is supplied to the wafer 200, may be set to be a predetermined time period which falls within a range of, for example, 1 to 120 seconds, specifically 1 to 60 seconds. The temperature of the heater 207 is set such that the temperature of the wafer 200 becomes a predetermined temperature which falls within a range of, for example, 250 to 700 degrees C., specifically 300 to 650 degrees C., more specifically 350 to 600 degrees C.

If the temperature of the wafer 200 is lower than 250 degrees C., a practical deposition rate may not be obtained because the HCDS is hardly chemisorbed onto the wafer 200. This can be solved by setting the temperature of the wafer 200 to become 250 degrees C. or higher. By setting the temperature of the wafer 200 to become 300 degrees C. or higher, further 350 degrees C. or higher, it is possible to more sufficiently adsorb the HCDS onto the wafer 200 and to obtain a more sufficient deposition rate.

If the temperature of the wafer 200 exceeds 700 degrees C., an excessive gas phase reaction may occur. Thus, the film thickness uniformity is likely to be deteriorated and the control of the film thickness uniformity is difficult. By setting the temperature of the wafer 200 to be 700 degrees C. or lower, it is possible to suppress the deterioration of the film thickness uniformity while generating a moderate gas phase reaction and to control the film thickness uniformity. In particular, by setting the temperature of the wafer 200 to be 650 degrees C. or lower, further 600 degrees C. or lower, the surface reaction becomes dominant over the gas phase reaction. This makes it easy to secure the film thickness uniformity and to control the film thickness uniformity.

By supplying the HCDS gas to the wafer 200 under the aforementioned conditions, a first layer, for example, an Si-containing layer containing Cl and having a thickness of, e.g., about less than one atomic layer (one molecular layer) to several atomic layers (several molecular layers) is formed on the uppermost surface of the wafer 200. The Si-containing layer containing Cl may be an Si layer containing Cl, an adsorption layer of the HCDS, or both.

The Cl-containing Si layer generally refers to layers including a Cl-containing continuous layer formed of Si, a Cl-containing discontinuous layer formed of Si, and a Cl-containing Si thin film formed by laminating the continuous layer and the discontinuous layer. Si constituting the Cl-containing Si layer includes Si whose bond to Cl is not completely broken and Si whose bond to Cl is completely broken.

The adsorption layer of the HCDS includes a continuous adsorption layer of HCDS molecules and a discontinuous adsorption layer of HCDS molecules. The HCDS molecules constituting the adsorption layer of the HCDS include molecules in which an Si—Cl bond is partially broken. That is, the adsorption layer of the HCDS may include a physisorption layer of the HCDS, a chemisorption layer of the HCDS, or both.

Here, the layer having a thickness of less than one atomic layer (one molecular layer) refers to an atomic layer (molecular layer) which is discontinuously formed, and the layer having a thickness equal to one atomic layer (one molecular layer) refers to an atomic layer (molecular layer) which is continuously formed. The Si-containing layer containing Cl may include both the Cl-containing Si layer and the adsorption layer of the HCDS. However, as described above, the Si-containing layer containing Cl will be represented by the expression of "one atomic layer," "several atomic layers" or the like, and the "atomic layer" may be synonymous with the "molecular layer".

Under a condition in which the HCDS gas is self-decomposed (pyrolyzed), namely under a condition in which a pyrolysis reaction of the HCDS gas occurs, Si is deposited on the wafer 200 to form a Cl-containing Si layer. Under a condition in which the HCDS gas is not autolyzed (not pyrolyzed), namely under a condition in which a pyrolysis reaction of the HCDS gas does not occur, the HCDS is adsorbed onto the wafer 200 to form an adsorption layer of the HCDS. From the viewpoint of enhancing the deposition rate, forming the Cl-containing Si layer on the wafer 200 is more desirable than forming the adsorption layer of the HCDS on the wafer 200. Hereinafter, the Si-containing layer containing Cl is also referred to simply as an Si-containing layer for convenience' sake.

If the thickness of the first layer exceeds several atomic layers, a modification reaction at steps 2 to 4 described herein below fails to reach the entirety of the first layer. In addition, a minimum value of the thickness of the first layer is less than one atomic layer. Accordingly, it is desirable that the thickness of the first layer be approximately from less than one atomic layer to several atomic layers. By setting the thickness of the first layer at one atomic layer or less, namely one atomic layer or less than one atomic layer, it is possible to relatively increase the modification reaction at steps 2 to 4, which will be described herein below, and to shorten the time required for the modification reaction at steps 2 to 4.

Furthermore, it is also possible to shorten the time required in forming the first layer at step 1. As a result, it is possible to shorten the processing time per one cycle and to shorten the total processing time. That is, it is also possible to increase the deposition rate. By setting the thickness of the first layer at one atomic layer or less, it is also possible to enhance the controllability of the film thickness uniformity.

After the first layer is formed, the valve 243a is closed to stop the supply of the HCDS gas.

As the precursor, it may be possible to use, in addition to the HCDS gas, an inorganic precursor gas such as a dichlorosilane ($SiH_2Cl_2$, abbreviation: DCS) gas, a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas, a monosilane ($SiH_4$, abbreviation: MS) gas or the like, or an organic precursor gas such as a tetrakis-dimethylaminosilane ($Si[N(CH_3)_2]_4$, abbreviation: 4DMAS) gas, a tris-dimethylaminosilane ($Si[N(CH_3)_2]_3H$, abbreviation: 3DMAS) gas, a bis-diethylaminosilane ($Si[N(C_2H_5)_2]_2H_2$, abbreviation: BDEAS) gas, a bis-tert-butylaminosilane ($SiH_2[NH(C_4H_9)]_2$, abbreviation: BTBAS) gas, a tetrachlorodimethyldisilane (($CH_3)_2Si_2Cl_4$, abbreviation: TCDMDS) gas or the like.

As the inert gas, it may be possible to use, in addition to the $N_2$ gas, a rare gas such as an Ar gas, an He gas, an Ne gas, a Xe gas or the like.

[$N_2$ Plasma Process]
(Step 2)

After step 1 is completed, a gas purge or vacuumization is not performed in the process chamber 201 and an $N_2$ gas activated by plasma (plasma-excited) (hereinafter, also referred to as a "plasma-excited $N_2$ gas") is supplied to the wafer 200, i.e., the first layer formed on the wafer 200, in the process chamber 201. That is, an $N_2$ plasma process starts to be performed on the first layer immediately after completion of step 1.

The supply of the $N_2$ gas into the gas supply pipe 232d is maintained while opening the valve 243d. The flow rate of the $N_2$ gas is adjusted by the MFC 241d. The $N_2$ gas is supplied into the buffer chamber 237 via the nozzle 249b. At this time, RF power is applied between the rod-shaped electrodes 269 and 270 from the high-frequency power source 273 through the matcher 272, whereby the $N_2$ gas supplied into the buffer chamber 237 is plasma-excited, and is supplied as a plasma-excited $N_2$ gas containing excited species, i.e., active species ($N_2$), from the gas supply hole 250c into the process chamber 201 and is exhausted from the exhaust pipe 231. At this time, the plasma-excited $N_2$ gas is supplied to the wafer 200. Also at this time, the valve 243c is kept open.

The supply flow rate of the $N_2$ gas controlled by the MFC 241d may be set at a predetermined flow rate which falls within a range of, for example, 100 to 10,000 sccm. The internal pressure of the process chamber 201 may be set to be a predetermined pressure which falls within a range of, for example, 1 to 4,000 Pa, specifically, 1 to 3,000 Pa. The time period, during which the plasma-excited $N_2$ gas is supplied to the wafer 200, may be set to be a predetermined time period which falls within a range of, for example, 1 to 120 seconds, specifically, 1 to 60 seconds. The RF power applied between the rod-shaped electrodes 269 and 270 may be set to be a predetermined electric power which falls within a range of, for example, 50 to 1,000 W. Other processing conditions may be similar to, for example, the processing conditions of step 1.

At this time, the gas flowing into the process chamber 201 is the plasma-excited $N_2$ gas, and the HCDS gas does not flow into the process chamber 201. Thus, the plasma-excited $N_2$ gas does not cause a gas phase reaction and is supplied to the wafer 200 in an excited state. The plasma-excited $N_2$ gas supplied to the wafer 200 reacts with at least a portion of the first layer formed on the wafer 200 at step 1. Accordingly, the first layer is modified by $N_2$* or the like so as to be changed to a second layer.

Furthermore, since the gas purge or vacuumization is not performed before initiation of step 2 after completion of step 1, the processing using $N_2$* or the like is performed before an impurity such as Cl, H or the like is settled in a stable area of the first layer, namely while the impurity such as Cl, H or the like is unstable. That is, the processing using $N_2$* or the like starts before at least a portion of the impurity such as Cl, H or the like included in the layer formed by that time is stabilized. Thus, the impurity such as Cl, H or the like included in the first layer efficiently or effectively constitutes a gaseous substance containing at least Cl, H or the like in the course of the modification reaction using $N_2$* or the like, and is efficiently or effectively discharged from interior of the process chamber 201. That is, the impurity such as Cl, H or the like in the first layer is efficiently or effectively drawn or desorbed from the first layer so as to be separated from the first layer.

[$NH_3$ Plasma Process]
(Step 3)

After step 2 is completed, the gas purge or vacuumization is not performed in the process chamber 201 and an $NH_3$ gas excited by plasma (hereinafter, also referred to as a "plasma-excited $NH_3$ gas") is supplied to the wafer 200, i.e., the second layer formed on the wafer 200, in the process chamber 201. That is, an $NH_3$ plasma process starts to be performed on the second layer immediately after completion of step 2.

The valve 243b is opened to allow an $NH_3$ gas to flow through the gas supply pipe 232b. The flow rate of the $NH_3$ gas is adjusted by the MFC 241b. The $NH_3$ gas is supplied into the buffer chamber 237 via the nozzle 249b. At this time, RF power is applied between the rod-shaped electrodes 269 and 270 from the high-frequency power source 273 through the matcher 272, whereby the $NH_3$ gas supplied into the buffer chamber 237 is plasma-excited, and is supplied as a plasma-excited $NH_3$ gas containing excited species, i.e., active species ($NH_3$), from the gas supply hole 250c into the process chamber 201 and is exhausted from the exhaust pipe 231. At this time, the plasma-excited $NH_3$ gas is supplied to the wafer 200. Also at this time, the valves 243c and 243d are kept open.

The supply flow rate of the $NH_3$ gas controlled by the MFC 241b may be set at a predetermined flow rate which falls within a range of, for example, 100 to 10,000 sccm. The internal pressure of the process chamber 201 may be set to be a predetermined pressure which falls within a range of, for example, 1 to 4,000 Pa, specifically, 1 to 3,000 Pa. The time period, during which the plasma-excited $NH_3$ gas is supplied to the wafer 200, may be set to be a predetermined time period which falls within a range of, for example, 1 to 120 seconds, specifically, 1 to 60 seconds. The RF power applied between the rod-shaped electrodes 269 and 270 may be set to be a predetermined electric power which falls within a range of, for example, 50 to 1,000 W. Other processing conditions may be similar to, for example, the processing conditions of step 1. Furthermore, at this time, the $NH_3$ gas may be supplied to the wafer 200 by thermally activating (exciting) the same under a non-plasma state.

At this time, the gas flowing into the process chamber 201 is the plasma-excited $NH_3$ gas, and the HCDS gas does not flow into the process chamber 201. Thus, the plasma-excited $NH_3$ gas does not cause a gas phase reaction and is supplied to the wafer 200 in an excited state. The plasma-excited $NH_3$ gas supplied to the wafer 200 reacts with at least a portion of the second layer formed on the wafer 200 at step 2. Accordingly, the second layer is nitrided (modified) by $NH_3$* or the like so as to be changed to a third layer, i.e., a silicon nitride layer (SiN layer).

Furthermore, since the gas purge or vacuumization is not performed before initiation of step 3 after completion of step 2, the processing using $NH_3$ or the like is performed before the impurity such as Cl, H or the like is settled in a stable area of the second layer, namely while the impurity such as Cl, H or the like is unstable. That is, the processing using $NH_3$* or the like starts before at least a portion of the impurity such as Cl, H or the like included in the layer formed by that time is stabilized. Thus, the impurity such as Cl, H or the like included in the second layer efficiently or effectively constitutes a gaseous substance containing at least Cl, H or the like in the course of the modification reaction using $NH_3$* or the like, and is efficiently or effectively discharged from interior of the process chamber 201. That is, the impurity such as Cl, H or the like in the second layer is efficiently or effectively drawn or desorbed from the second layer so as to be separated from the second layer.

After the third layer is formed, the valve 243b is closed to stop the supply of the $NH_3$ gas.

As the nitriding agent, it may be possible to use, in addition to the $NH_3$ gas, a hydrogen nitride-based gas such as a diazene ($N_2H_2$) gas, a hydrazine ($N_2H_4$) gas, an $N_3H_8$ gas or the like, a gas containing these compounds, or the like. Furthermore, as the nitriding agent, it may be possible to use, in addition to these gases, a gas containing amine, i.e., an amine-based gas. As the amine-based gas, it may be possible to use a monomethylamine ($CH_3NH_2$, abbreviation: MMA) gas, a dimethylamine (($CH_3)_2NH$, abbreviation: DMA) gas, a trimethylamine (($CH_3)_3N$, abbreviation: TMA) gas, a monoethylamine ($C_2H_5NH_2$, abbreviation: MEA) gas, a diethylamine ($(C_2H_5)_2NH$, abbreviation: DEA) gas, a triethylamine (($C_2H_5)_3N$, abbreviation: TEA) gas or the like. In addition, as the nitriding agent, it may be possible to use a gas containing an organic hydrazine compound, i.e., an organic hydrazine-based gas. As the organic hydrazine-based gas, it may be possible to use a monomethylhydrazine (($CH_3)HN_2H_2$, abbreviation: MMH) gas, a dimethylhydrazine (($CH_3)_2N_2H_2$, abbreviation: DMH) gas, a trimethylhydrazine (($CH_3)_2N_2$ ($CH_3)H$, abbreviation; TMH) gas or the like.

[$N_2$ Plasma Process]
(Step 4)

After step 3 is completed, the gas purge or vacuumization is not performed in the process chamber 201 and a plasma-excited $N_2$ gas is supplied to the wafer 200, i.e., the third layer formed on the wafer 200, in the process chamber 201. That is, an $N_2$ plasma process starts to be performed on the third layer immediately after completion of step 3. The valve opening/closing control, the processing sequences and the like at this time are similar to those of step 2 and the processing conditions are also similar to those of step 2.

At this time, the gas flowing into the process chamber 201 is the plasma-excited $N_2$ gas, and the HCDS gas does not flow into the process chamber 201. Thus, the plasma-excited $N_2$ gas does not cause a gas phase reaction and is supplied to the wafer 200 in an excited state. The plasma-excited $N_2$ gas supplied to the wafer 200 reacts with at least a portion of the third layer formed on the wafer 200 at step 3. Accordingly, the third layer is modified by $N_2$* or the like so as to be changed to a fourth layer.

Furthermore, since the gas purge or vacuumization is not performed before initiation of step 4 after completion of step 3, the processing using $N_2$* or the like is performed before the impurity such as Cl, H or the like is settled in a stable area of the third layer, namely while the impurity such as Cl, H or the like is unstable. That is, the processing using $N_2$* or the like starts before at least a portion of the impurity such as Cl, H or the like included in the layer formed by that time is stabilized. Thus, the impurity such as Cl, H or the like included in the third layer efficiently or effectively constitutes a gaseous substance containing at least Cl, H or the like in the course of the modification reaction using $N_2$* or the like, and is efficiently or effectively discharged from interior of the process chamber 201. That is, the impurity such as Cl, H or the like in the third layer is efficiently or effectively drawn or desorbed from the third layer so as to be separated from the third layer.

[Performing a Predetermined Number of Times]

A cycle which non-simultaneously, i.e., non-synchronously, performs steps 1, 2, 3 and 4 described above is implemented a predetermined number of times (n times). Thus, an SiN film can be formed on the wafer 200.

(Purge and Atmospheric Pressure Return)

After the aforementioned film forming process is completed, the $N_2$ gas is supplied from the gas supply pipes 232c and 232d into the process chamber 201 and is exhausted from the exhaust pipe 231. The $N_2$ gas acts as a purge gas. Thus, the interior of the process chamber 201 is purged and the gas or the reaction byproduct, which remains in the process chamber 201, is removed from the interior of the process chamber 201 (purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the reaction tube 203. The processed wafers 200 supported on the boat 217 are unloaded from the lower end of the reaction tube 203 to the outside of the reaction tube 203 (boat unloading). The processed wafers 200 are discharged from the boat 217 (wafer discharging).

(3) Effects according to the Present Embodiment

According to the present embodiment, one or more effects as set forth below may be achieved.

(a) By performing the $N_2$ plasma processes immediately after the supply of the HCDS gas is stopped and after the supply of the $NH_3$ gas is stopped, without substantially performing the gas purge and vacuumization, an environment in which the impurity such as Cl, H or the like is stabilized within a film, namely an environment in which the impurity such as Cl, H or the like forms a firm bond to other elements within the film, is eliminated, thereby reducing a concentration of impurity, particularly an H concentration.

Furthermore, when the gas purge or vacuumization is performed after the supply of the HCDS gas is stopped and after the supply of the $NH_3$ gas is stopped, since the wafer is kept in a heated state, the impurity such as Cl, H or the like is settled in a stable area within the film due to an annealing effect so as to be definitely included in the film and form a firm and stable bond. If the impurity such as Cl, H or the like is settled in a stable area within the film, it may be difficult to remove the impurity such as Cl, H or the like even when the $N_2$ plasma process is performed. Thus, it is necessary to perform the $N_2$ plasma process before the impurity such as Cl, H or the like forms a firm bond and is settled in a stable area within the film, namely while it is unstable. However, if the gas purge or vacuumization is performed for only about 1 to several seconds, e.g., 1 to 2 seconds, the annealing effect mentioned above becomes small. Therefore, this case may be also considered as being included in a case where the $N_2$ purge is not substantially performed.

In addition, an Ar plasma process may also be performed instead of the $N_2$ plasma process. However, since the molecule size of Ar is large, there may be a case where it collides with other molecules and it is hard for Ar to enter a narrow trench. Thus, $N_2$ having a smaller molecule size than Ar is effective for the film formation in the narrow trench.

(b) By non-simultaneously supplying the HCDS gas and the $NH_3$ gas at steps 1 and 3, under a condition in which the gas phase reaction or the surface reaction appropriately occurs, these gases can appropriately contribute to the reaction. As a result, it is possible to enhance the step coverage and the controllability in thickness of the film formed on the wafer 200. In addition, it is possible to prevent the occurrence of an excessive gas phase reaction within the process chamber 201 and also to suppress the generation of particles.

(c) The effects mentioned above can be similarly achieved in the case where a gas other than the HCDS gas is used as the precursor containing the first element, or in the case where a gas other than the $NH_3$ gas is used as the reactant (nitriding agent) containing the second element.

(4) Exemplary Modifications

The film forming sequence of the present embodiment is not limited to the ones illustrated in FIGS. 4 and 5 but may be modified as in the modifications described below.

(Modifications 1 to 8)

A silicon nitride film (SiN film), a silicon carbonitride film (SiCN film), a silicon oxycarbonitride film (SiOCN film), a silicon oxynitride film (SiON film), a silicon oxycarbide film (SiOC film), a silicon oxide film (SiO film), a silicon boronitride film (SiBN film), a silicon borocarbonitride film (SiBCN film) or the like may be formed on the wafer 200 by the film forming sequences (sequentially, modifications 1 to 8) illustrated below.

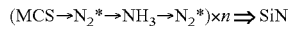

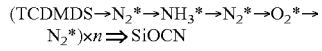

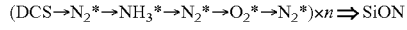

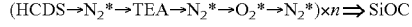

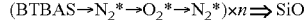

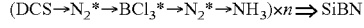

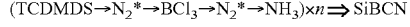

These modifications are examples in which the first element (major element) includes Si and the second element includes N, C, O or B. Even in these modifications, the same effects as those of the aforementioned embodiment can be achieved.

<Other Embodiments of the Present Disclosure>

While one embodiment of the present disclosure has been specifically described above, the present disclosure is not limited to the aforementioned embodiment but may be differently modified without departing from the scope of the present disclosure.

For example, there has been described an example in which, at steps 1 to 3 of the aforementioned embodiment, a cycle which sequentially supplies the precursor and the reactant (nitriding agent) is implemented a predetermined number of times. However, the present disclosure is not limited thereto and the precursor and the reactant may be supplied in a reverse order. That is to say, the precursor may be supplied after the supply of the reactant. By changing the supply order, it is possible to change the quality or the composition ratio of the thin film as formed. Furthermore, when plural kinds of reactants are used as in modifications 3 to 5, 7 and 8, the supply order of these reactants can be arbitrarily changed. By changing the supply order of the reactants, it is possible to change the quality and the composition ratio of the film as formed.

Figure 4:
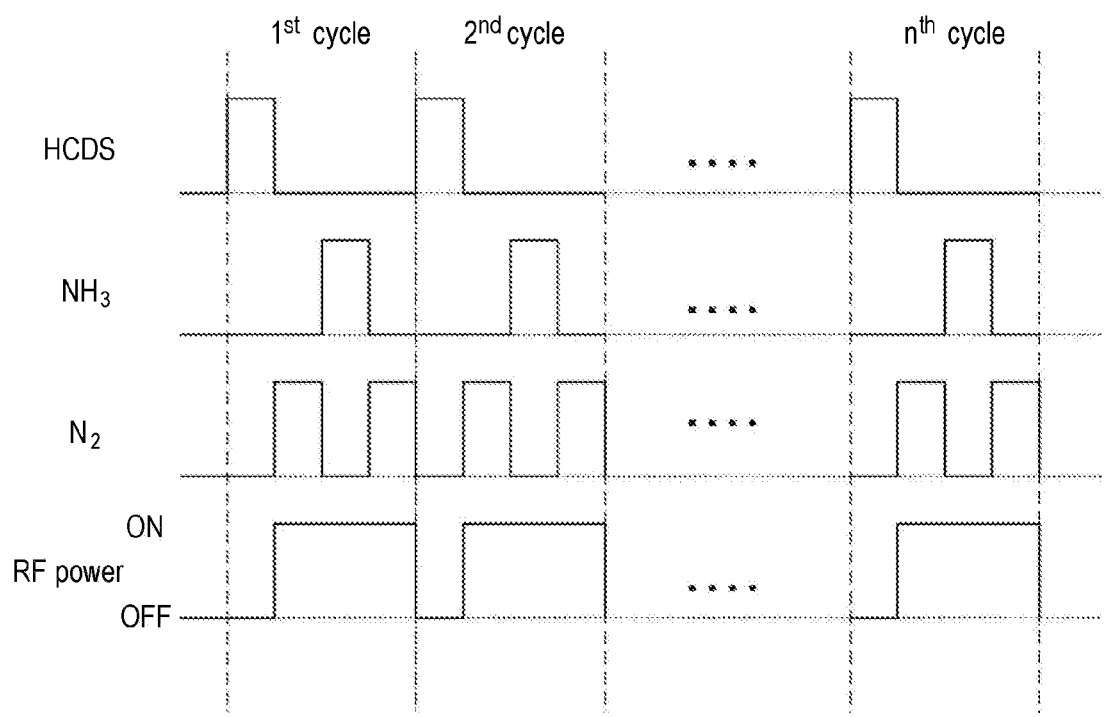
FIG. 4 is a diagram illustrating gas supply and plasma power supply timings in a film forming sequence according to one embodiment of the present disclosure.
Figure 5:
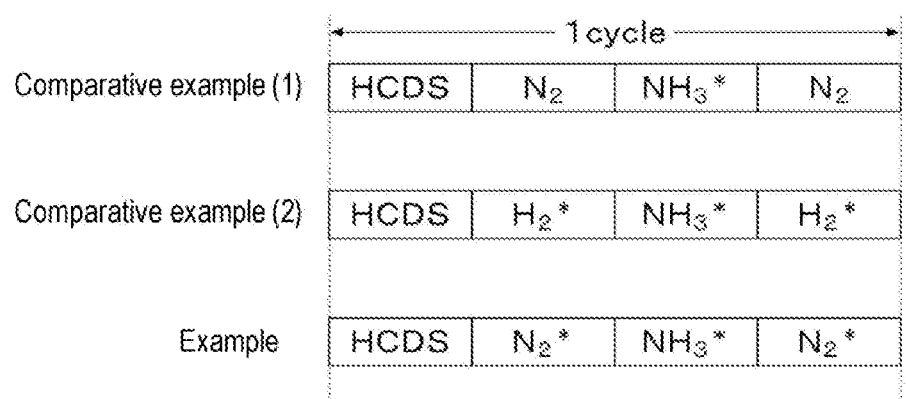
FIG. 5 is a diagram illustrating one cycle of film forming sequences of an example according to the present disclosure and comparative examples (1) and (2).

If a silicon-based insulating film formed by the film forming sequence illustrated in FIG. 4 or by the method of each of the modifications is used as a sidewall spacer, it is possible to provide a technique of forming a device which is small in leak current and is superior in processability. Furthermore, if the silicon-based insulating film mentioned above is used as an etch stopp, it is possible to provide a technique of forming a device which is superior in processability.

The aforementioned film forming sequence may be suitably applied to a case where a film containing, as a major element, a semimetal element such as boron (B) or germanium (Ge), in addition to Si, is formed, or a case where a film containing, as a major element, a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like is formed.

Recipes used in forming these various kinds of thin films may be prepared individually (prepared plurally) according to the contents of substrate processing. Moreover, at the start of substrate processing, it is desirable to properly select an appropriate recipe from the recipes according to the contents of substrate processing. Specifically, the recipes individually prepared according to the contents of substrate processing may be stored (or installed) in advance in the memory device 121c of the substrate processing apparatus via a telecommunication line or a recording medium (the external memory device 123) storing the recipes. In addition, at the start of the substrate processing, the CPU 121a of the substrate processing apparatus may properly select an appropriate recipe from the recipes stored in the memory device 121c according to the contents of substrate processing. With this configuration, it is possible for a single substrate processing apparatus to form thin films of different kinds, composition ratios, qualities and thicknesses for general purposes and with enhanced reproducibility. In addition, it is possible to reduce an operator's operation burden and to quickly start the substrate processing while avoiding operation errors.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which thin films are formed using a batch-type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace.

Figure 9A:
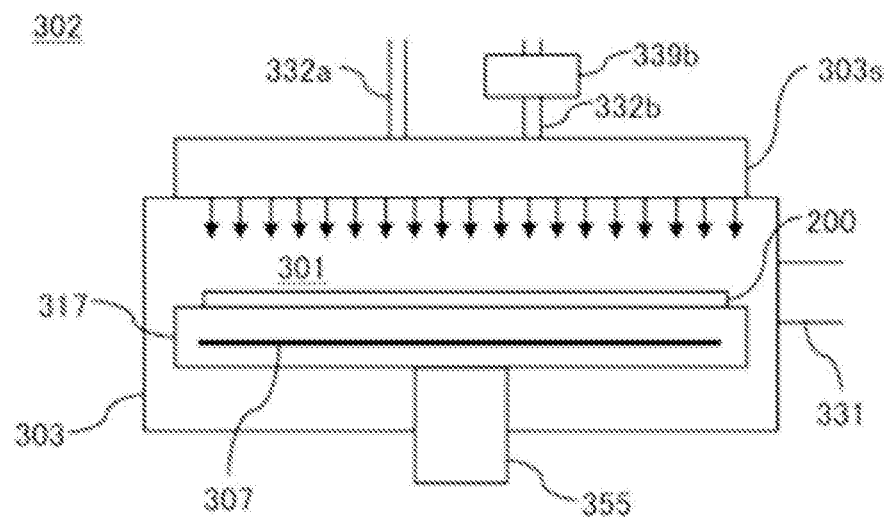
FIG. 9A is a schematic configuration diagram of a processing furnace of a substrate processing apparatus suitably used in another embodiment of the present disclosure, in which the portion of the processing furnace is shown in a vertical sectional view.

The present disclosure may be suitably applied to, e.g., a case where a film is formed using a substrate processing apparatus provided with a processing furnace 302 illustrated in FIG. 9A. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets of the shower head 303s. A supply system similar to the precursor supply system of the aforementioned embodiment is connected to the gas supply port 332a. A remote plasma unit 339b as an excitation part for plasma-exciting and supplying a reactant and a supply system similar to the reactant supply system of the aforementioned embodiment are connected to the gas supply port 332b. A gas distribution plate is installed in outlets of the shower head 303s. The shower head 303s is installed in such a position as to face the surfaces of the wafers 200 carried into the process chamber 301. An exhaust port 331 configured to evacuate the interior of the process chamber 301 is installed in the process vessel 303. An exhaust system similar to the exhaust system of the aforementioned embodiment is connected to the exhaust port 331.

Figure 9B:
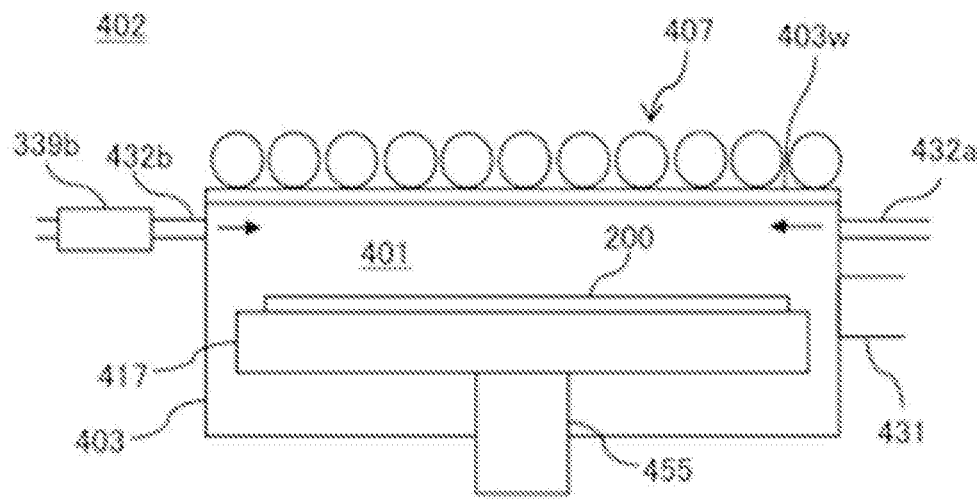
FIG. 9B is a schematic configuration diagram of a processing furnace of a substrate processing apparatus suitably used in yet another embodiment of the present disclosure, in which the portion of the processing furnace is shown in a vertical sectional view.

In addition, the present disclosure may be suitably applied to, e.g., a case where a film is formed using a substrate processing apparatus provided with a processing furnace 402 illustrated in FIG. 9B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 within the process vessel 403, and a quartz window 403w which transmits the light irradiated from the lamp heater 407. Gas supply ports 432a and 432b are connected to the process vessel 403. A supply system similar to the precursor supply system of the aforementioned embodiment is connected to the gas supply port 432a. The remote plasma unit 339b and a supply system similar to the reactant supply system of the aforementioned embodiment are connected to the gas supply port 432b. The gas supply ports 432a and 432b are respectively installed at the lateral side of the end portions of the wafers 200 carried into the process chamber 401. An exhaust port 431 configured to evacuate the interior of the process chamber 401 is installed in the process vessel 403. An exhaust system similar to the exhaust system of the aforementioned embodiment is connected to the exhaust port 431.

Even in the case of using these substrate processing apparatuses, film formation can be performed under the sequences and processing conditions similar to those of the embodiment and modifications described above. The same effects as those of the embodiment and the modifications described above may be achieved.

The embodiment and modifications described above may be appropriately combined with one another. In addition, the processing conditions used at this time may be similar to, for example, the processing conditions of the aforementioned embodiment.

Example

An example will be described below.

An SiN film was formed as a sample by the sequences of comparative example (1) and comparative example (2) and an example illustrated in FIG. 5 and shown below. The processing conditions in forming each sample were set to fall within the range of the processing conditions described in the aforementioned embodiment and so as to be common conditions over the samples.

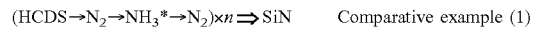

$(HCDS \rightarrow N_2 \rightarrow NH_3^* \rightarrow N_2) \times n \Rightarrow SiN$     Comparative example (1)

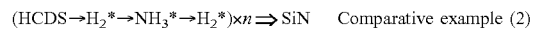

$(HCDS \rightarrow H_2^* \rightarrow NH_3^* \rightarrow H_2^*) \times n \Rightarrow SiN$     Comparative example (2)

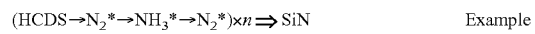

$(HCDS \rightarrow N_2^* \rightarrow NH_3^* \rightarrow N_2^*) \times n \Rightarrow SiN$     Example Then, an H concentration, a Cl concentration, and a wet etching rate (hereinafter, also referred to as WER) of each sample were measured. WER was measured by wet-etching each sample (SiN film) using an HF aqueous solution (DHF) diluted to a concentration of 1%.

Figure 6:
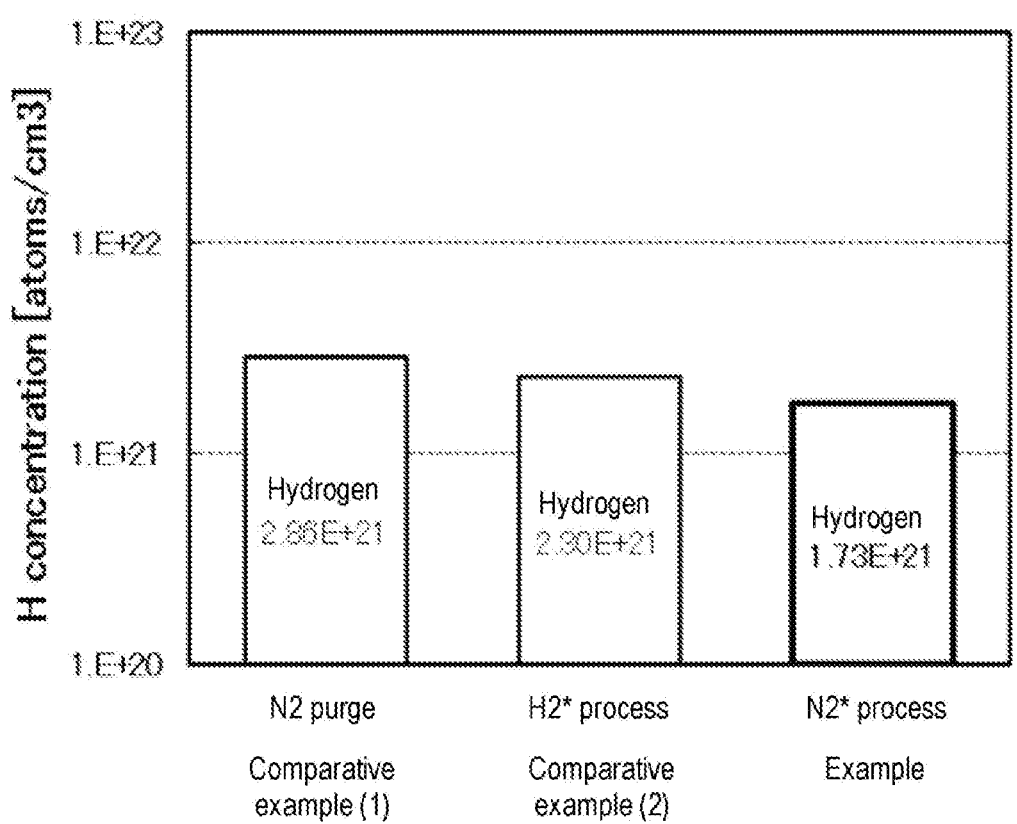
FIG. 6 is a diagram illustrating hydrogen concentrations within SiN films formed according to the example of the present disclosure and comparative examples (1) and (2).
Figure 7:
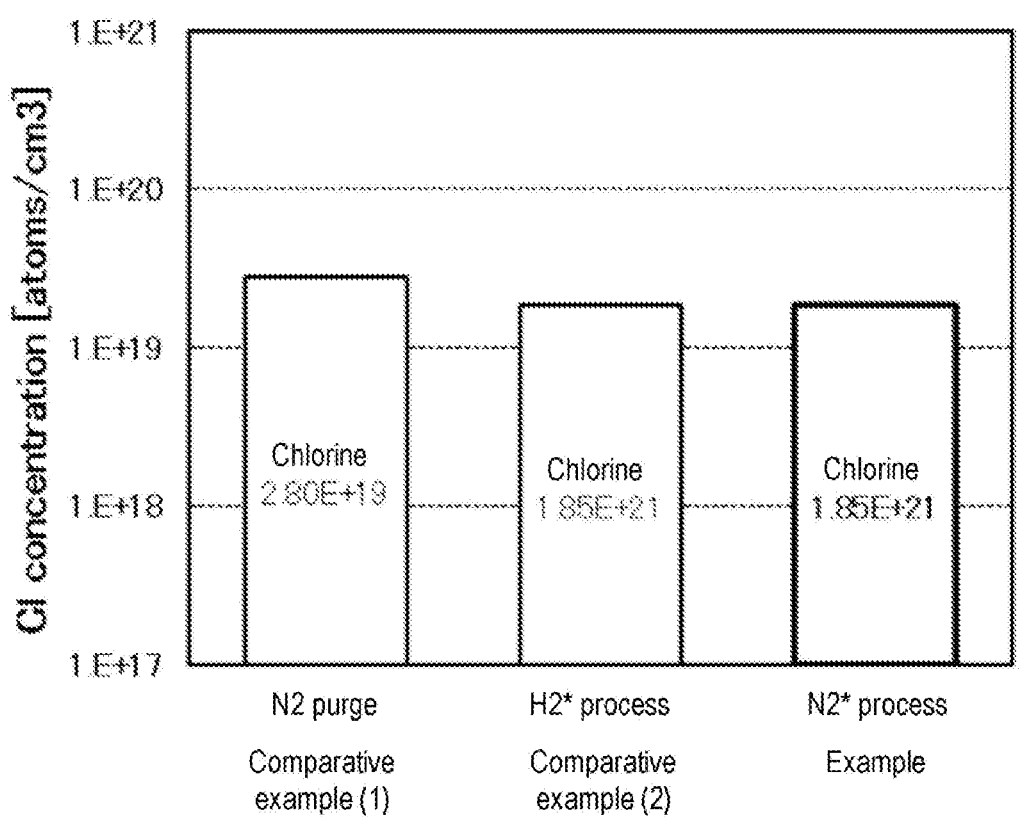
FIG. 7 is a diagram illustrating chlorine concentrations within the SiN films formed according to the example of the present disclosure and comparative examples (1) and (2).
Figure 8:
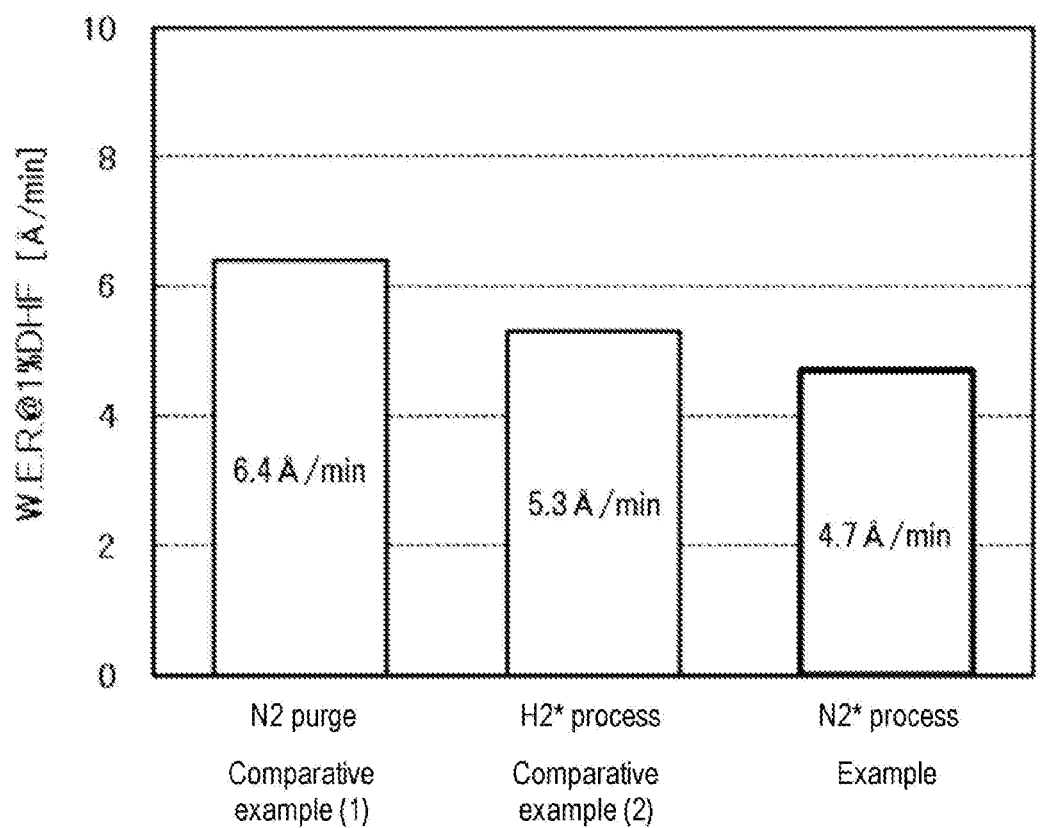
FIG. 8 is a diagram illustrating hydrofluoric acid wet etching resistance of the SiN films formed according to the example of the present disclosure and comparative examples (1) and (2).

FIGS. 6, 7, and 8 respectively illustrate the measurement results of H concentration, Cl concentration, and WER of each sample. In FIGS. 6, 7, and 8, all the horizontal axes represent comparative example (1), comparative example (2), and the example. In FIGS. 6, 7, and 8, the vertical axes respectively represent H concentration (atoms/cm$^3$, Cl concentration (atoms/cm$^3$), and WER (Å/min).

From FIG. 6, it can be seen that the H concentration of the sample of the example is lower than the H concentrations of samples of comparative example (1) and comparative example (2). This indicates that H is efficiently or effectively desorbed from the film by performing the processing using $N_2^*$ or the like before H is stabilized in the film. Furthermore, in both comparative example (2) and the example, the plasma-excited gases ($H_2^*$ and $N_2^*$) are allowed to flow after the HCDS gas is supplied and after the $NH_3$ gas is supplied. However, the H concentration of the sample of comparative example (2) is higher than the H concentration of the sample of the example. This is caused because, in a case where the processing is performed using $H_2^*$ or the like, H of $H_2^*$ is included in the film.

From FIG. 7, it is understood that the Cl concentration of the sample of the example is lower than the Cl concentration of the sample of comparative example (1) and equal to the Cl concentration of the sample of comparative example (2). This indicates that, in both the processing using $N_2^*$ or the like and the processing using $H_2^*$ or the like, Cl is desorbed from the film before Cl is stabilized in the film. It can be seen that the effect of reducing the Cl concentration in the film shows no difference between the processing using $N_2^*$ or the like and the processing using $H_2^*$ or the like.

From FIG. 8, it can be seen that the WER of the sample of the example is lower than the WERs of the samples of comparative example (1) and comparative example (2). This is considered to be because the H concentration of the sample of the example is lower than the H concentrations of the samples of comparative example (1) and comparative example (2). That is to say, it can be seen that the wet etching resistance of the sample of the example is higher than wet etching resistances of the samples of comparative example (1) and comparative example (2). In this sense, it can be recognized that it is possible to dramatically enhance the wet etching resistance by performing the processing using $N_2^*$ or the like at an appropriate timing.

According to the present disclosure in some embodiments, it is possible to reduce a hydrogen concentration in a film, and to form a high quality film with excellent etching resistance.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate by performing a cycle a predetermined number of times, the cycle including non-simultaneously performing:
        (a) supplying a precursor containing a first element to the substrate;
        (b) supplying a plasma-excited $N_2$ gas to the substrate after (a);
        (c) supplying a reactant containing a second element to the substrate after (b); and
        (d) supplying a plasma-excited $N_2$ gas to the substrate after (c),
    wherein (b) initiates immediately after completion of (a) under a condition in which a gas purge of a space where the substrate is located and non-gas-supplying vacuumization of the space are not performed, and
    wherein (d) initiates immediately after completion of (c) under the condition in which the gas purge and the non-gas-supplying vacuumization are not performed.

2. The method of claim 1, wherein a first layer containing the first element is formed in (a),
    at least a portion of the first layer is modified in (b),
    the modified first layer is further modified to form a second layer containing the first element and the second element in (c),
    at least a portion of the second layer is modified in (d), and
    (b) starts before hydrogen contained in the first layer is stabilized.

3. The method of claim 2, wherein (c) starts before hydrogen contained in the modified first layer is stabilized.

4. The method of claim 2, wherein (d) starts before hydrogen contained in the second layer is stabilized.

5. The method of claim 1, wherein (c) starts immediately after completion of (b).

6. The method of claim 1, wherein (a) in a next cycle starts immediately after completion of (d).

7. The method of claim 1, wherein the reactant, which is plasma-excited, is supplied in (c).

8. The method of claim 1, wherein at least one of the precursor and the reactant contains hydrogen.

9. The method of claim 1, wherein the precursor contains hydrogen and the reactant does not contain hydrogen.

10. The method of claim 1, wherein the precursor does not contain hydrogen and the reactant contains hydrogen.

11. The method of claim 1, wherein each of the precursor and the reactant contains hydrogen.

12. The method of claim 1, wherein no hydrogen is supplied and introduced to the film during (b) and (d).

13. The method of claim 2, wherein no hydrogen is supplied and introduced to the first layer during (b).

14. The method of claim 2, wherein no hydrogen is supplied and introduced to the second layer during (d).

* * * * *